US009788407B2

(12) United States Patent
Goeders et al.

(10) Patent No.: US 9,788,407 B2
(45) Date of Patent: *Oct. 10, 2017

(54) MICRO-STRUCTURED ATOMIC SOURCE SYSTEM

(71) Applicant: Honeywell International Inc., Morris Plains, NJ (US)

(72) Inventors: James Goeders, Plymouth, MN (US); Matthew S. Marcus, Plymouth, MN (US); Thomas Ohnstein, Roseville, MN (US); Terry Dean Stark, St. Louis Park, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,295

(22) Filed: Jan. 24, 2017

(65) Prior Publication Data

US 2017/0135193 A1    May 11, 2017

Related U.S. Application Data

(63) Continuation of application No. 14/682,810, filed on Apr. 9, 2015, now Pat. No. 9,585,237.

(51) Int. Cl.
*H01S 1/00*      (2006.01)
*H05H 3/02*      (2006.01)
*B81B 7/02*      (2006.01)
*B81C 1/00*      (2006.01)

(52) U.S. Cl.
CPC ............... *H05H 3/02* (2013.01); *B81B 7/02* (2013.01); *B81C 1/00158* (2013.01); *B81B 2203/0127* (2013.01); *B81C 2201/0132* (2013.01); *B81C 2201/0133* (2013.01)

(58) Field of Classification Search
CPC ........ H01J 49/00; H01J 49/02; H01J 49/0409; H01J 49/0459; H01J 49/0468; H01J 49/0472; H01J 49/049
USPC .......................... 250/251, 281, 282, 288, 285
See application file for complete search history.

(56) References Cited

U.S. PATENT DOCUMENTS

| 4,895,616 A |   | 1/1990  | Higashi et al. |         |
|-------------|---|---------|----------------|---------|
| 5,055,672 A | * | 10/1991 | Nagai          | H05H 3/02 |
|             |   |         |                | 250/251 |
| 9,585,237 B2| * | 2/2017  | Goeders        | H05H 3/02 |
| 2005/0009070 A1 |   | 1/2005 | Arciniegas et al. | |
| 2006/0054807 A1 |   | 3/2006 | Picard et al. | |

(Continued)

OTHER PUBLICATIONS

Examination Report from related European Application No. 161635715, dated Jan. 17, 2017, 5 pages.

(Continued)

*Primary Examiner* — Jason McCormack
(74) *Attorney, Agent, or Firm* — Brooks, Cameron & Huebsch, PLLC

(57) ABSTRACT

A micro-structured atomic source system is described herein. One system includes a silicon substrate, a dielectric diaphragm, wherein the dielectric diaphragm includes a heater configured to heat an atomic source substance, an intermediary material comprising a chamber configured to receive the atomic source substance, and a guide material configured to direct a flux of atoms from the atomic source substance.

20 Claims, 5 Drawing Sheets

(56) References Cited

U.S. PATENT DOCUMENTS

2008/0060454 A1* 3/2008 Pan .................... B01L 3/50857
  73/863.11
2008/0067356 A1   3/2008 Goodley et al.
2010/0078550 A1   4/2010 Wiseman et al.
2014/0334991 A1   11/2014 Johnson et al.
2015/0249001 A1   9/2015 Piper

OTHER PUBLICATIONS

Meyer, et al., "Small-Scale Deposition of Thin Films and Nanoporticles by Microevaporation Sources", Journal of Microelectromechanical Systems, vol. 20, No. 1, Feb. 1, 2011, 7 pages.

Hamann, et al., "Micro-hotplates for high-throughput thin film processing and in situ phase transformation characterization", Sensors and Acuators A: Physical, vol. 147, No. 2, Oct. 3, 2008, 7 pages.

Extended Search Report from related EP Patent Application No. 16163573, dated Sep. 8, 2016, 8 pages.

* cited by examiner

MICRO-STRUCTURED ATOMIC SOURCE SYSTEM

CROSS-REFERENCE TO RELATED APPLICATIONS

The present application claims priority to U.S. application Ser. No. 14/682,810, filed Apr. 9, 2015 and EP Application No. 16163573.5 filed Apr. 1, 2016, the specifications of which is herein incorporated by reference.

TECHNICAL FIELD

The present disclosure relates to a micro-structured atomic source system.

BACKGROUND

Atoms of various source materials may be needed for scientific testing. For example, a test may call for atoms of a certain metal to be directed to a target location. Typically, the atoms generated can be very high in number and have little directional input. It can be difficult, however, to create and precisely direct a stream of atoms from a source material into a small target location.

Additionally, it can be difficult to provide multiple different sources of atoms of different species from a small area. For example, a test may call for different atoms from multiple different source materials, such as silver and iron. It can be advantageous to provide both sources of atoms from the two different source materials from a small area, as the test area itself may be small.

DETAILED DESCRIPTION

A micro-structured atomic source system is described herein. For example, one or more embodiments include a silicon substrate, a dielectric diaphragm, wherein the dielectric diaphragm includes a heater configured to heat an atomic source substance, an intermediary material comprising a chamber configured to receive the atomic source substance, and a guide material configured to direct a flux of atoms from the atomic source substance.

A micro-structured atomic source system, in accordance with the present disclosure, can generate atoms and more precisely direct a stream of atoms towards a target location. For example, iron atoms used for a scientific test can be generated and precisely directed to a testing location. Additionally, the micro-structured atomic source system can generate atoms from multiple different source materials, and direct the atoms accordingly.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

Figure 1:
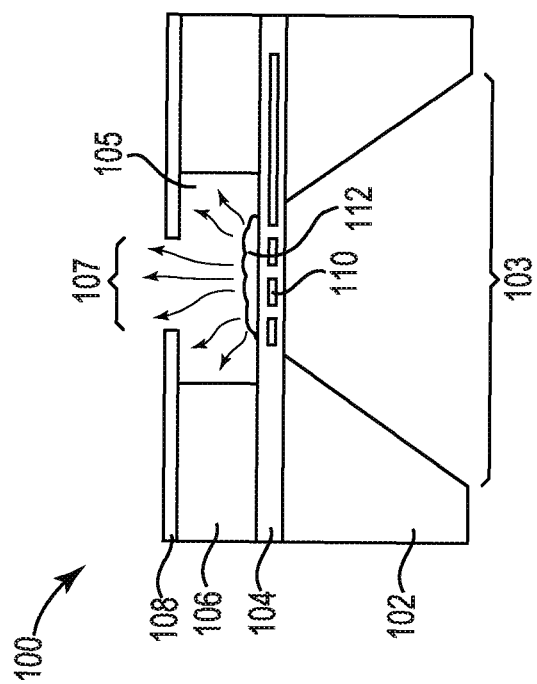
FIG. 1 illustrates a micro-structured atomic source system, in accordance with one or more embodiments of the present disclosure.

Directional terms such as "horizontal" and "vertical" are used with reference to the component orientation depicted in FIG. 1. These terms are used for example purposes only and are not intended to limit the scope of the appended claims.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be reference as 204 in FIG. 2.

As used herein, "a" or "a number of" something can refer to one or more such things. For example, "a number of temperature sensors" can refer to one or more temperature sensors.

FIG. 1 illustrates a micro-structured atomic source system 100, in accordance with one or more embodiments of the present disclosure. As shown in FIG. 1, the micro-structured atomic source system 100 includes a silicon substrate 102, a dielectric diaphragm 104, an intermediary material 106 comprising a chamber 105 configured to receive an atomic source substance 112, and a guide material 108 configured to direct a flux of atoms from atomic source substance 112.

Intermediary material 106, as shown in FIG. 1, can be a material comprising a chamber 105 configured to receive an atomic source substance 112. Intermediary material 106 can be an oxide material. For example, intermediary material 106 can be silicon dioxide.

Chamber 105 can be a cavity within intermediary material 106. For example, chamber 105 can be a cavity that can have dimensions such that the cavity is adjacent to guide material 108 and dielectric diaphragm 104, as illustrated in FIG. 1.

Atomic source substance 112 can be any material placed within chamber 105 that can generate atoms when heated, as will be further described herein. For example, atomic source substance 112 can be a material such as iron that when placed in chamber 105 and heated, will generate a flux of atoms. As an additional example, atomic source substance 112 can be a material such as silver that when heated, will generate a flux of atoms.

Chamber 105 can be created by etching intermediary material 106. As used herein, etching is a process used in microfabrication to chemically remove layers from the surface of a material (e.g., intermediary material 106). For example, intermediary material 106 can be etched to create chamber 105.

In some embodiments, chamber 105 can be created using an isotropic wet etch. For example, using an isotropic wet etch can allow for an etchant substance to etch intermediary material 106 in a horizontal as well as vertical direction simultaneously to create chamber 105.

In some embodiments, chamber 105 can be created using a combination of dry etching and wet etching. For example, using a dry etching technique can allow for etching of intermediary material 106 in a vertical direction, and subsequently using a wet etching technique can allow for etching of intermediary material 106 in a horizontal direction.

Although not shown in FIG. 1, dielectric diaphragm 104 can include a plurality of materials. For example, one material of dielectric diaphragm 104 can be a dielectric material (e.g., silicon nitride). A second material of dielectric diaphragm 104 can be a metal material that includes a heater 110 and a number of temperature sensors. Heater 110 can be a metal resistive heater with a well-controlled temperature coefficient of resistance. For example, heater 110 of dielectric diaphragm 104 can be platinum, a nickel/iron alloy, or any other suitable material with a well-controlled temperature coefficient of resistance. The third material of dielectric diaphragm 104 can be another dielectric material (e.g., silicon nitride).

Although the materials comprising dielectric diaphragm 104 are described as including materials such as silicon nitride, platinum, or a nickel/iron alloy, embodiments of the present disclosure are not so limited. For example, the materials comprising dielectric diaphragm 104 can include any other suitable material.

Heater 110 can be configured to heat atomic source substance 112, as will be further described herein. Heater 110 can be a metal resistive heater that converts electricity into heat through resistive heating. For example, electric current can be passed through a heating element of heater 110, and the resistance encountered by the current in the heating element can generate heat.

Although not shown in FIG. 1, dielectric diaphragm 104 can include a number of temperature sensors that can determine the temperature of heater 110. Temperature sensors can include thermistors, thermocouples, resistance thermometers, or any other suitable type of temperature sensor. The temperature of heater 110 can be controlled in order to control the flux of atoms generated from atomic source substance 112, as will be further described herein. Additionally, the temperature of heater 110 can be controlled to prevent the temperature of heater 110 from becoming too hot and expelling the flux of atoms too quickly.

As shown in FIG. 1, dielectric diaphragm 104 can be adjacent to intermediary material 106. For example, dielectric diaphragm 104 can be located directly adjacent to intermediary material 106 such that heater 110 can be adjacent to chamber 105.

Atomic source substance 112 can be located adjacent to heater 110. For example, atomic source substance 112 can be located in chamber 105 such that atomic source substance 112 can be located adjacent to dielectric diaphragm 104 comprising heater 110.

In the example shown in FIG. 1, atomic source substance 112 can be a thin-film substance. For example, atomic source substance 112 can be a thin-film when deposited in chamber 105, as will be further described herein (e.g., in connection with FIGS. 4 and 5). Atomic source substance 112 can comprise small granules or powder such that when atomic source substance 112 is deposited in chamber 105 it forms a thin film adjacent to heater 110.

In some embodiments, the thin film of atomic source substance 112 can adhere to the surface of dielectric diaphragm 104. For example, atomic source substance 112 can adhere (e.g., stick) to the surface of dielectric diaphragm 104 when atomic source substance 112 is heated by heater 110. Adhesion to the surface of dielectric diaphragm 104 by atomic source substance 112 can be beneficial when microstructured atomic source system 100 is placed in certain orientations (e.g., micro-structured atomic source system 100 is not in a horizontal orientation as shown in FIG. 1).

Heater 110 can be configured to sublimate atomic source substance 112. As used herein, sublimation refers to a phase transition of a substance directly from a solid phase to a gas phase without passing through an intermediate liquid phase. For example, heater 110 can heat atomic source substance 112 so that atomic source substance 112 sublimates from a solid to a gas. As a result of the sublimation of atomic source substance 112, a flux of atoms can be generated from atomic source substance 112.

As shown in FIG. 1, a guide material 108 can be configured to direct a flux of atoms from atomic source substance 112. Guide material 108 can be any material that is compatible with the manufacturing process of micro-structured atomic source system 100. For example, guide material 108 can be any material (e.g., metal) compatible with the etching processes of intermediary material 106 and silicon substrate 102, as will be further described herein. That is, guide material 108 can be a metal (e.g., gold) compatible with the manufacturing process of micro-structured atomic source system 100.

Guide material 108 can be adjacent to intermediary material 106 and have an opening 107 to direct the flux of atoms from atomic source substance 112. For example, opening 107 can direct the flux of atoms resulting from sublimation of atomic source substance 112. That is, opening 107 can be selected to direct the flux of atoms from atomic source substance 112 in a directional manner.

In some embodiments, opening 107 can be formed by etching guide material 108. For example, opening 107 can be etched using a wet etch process. However, embodiments of the present disclosure are not so limited. For example, opening 107 can be etched using any suitable etching process.

In some embodiments, opening 107 can be formed using an ion milling technique. As used herein, ion milling is a process used in microfabrication to remove layers from the surface of a material (e.g., guide material 108) by firing ions at the surface from an angle and sputtering material from the surface of the material. For example, guide material 108 can be ion milled to form opening 107.

The dimensions (e.g., size) of opening 107 in guide material 108 can be selected to direct the flux of atoms from atomic source substance 112. For example, the dimensions of opening 107 can be selected based on the target the flux of atoms from atomic source substance 112 is intended to be directed towards. That is, the dimensions of opening 107 can be selected to direct the flux of atoms from atomic source substance 112 in a specified direction.

Silicon substrate 102, in the example shown in FIG. 1, can be a base material upon which micro-structured atomic source system 100 is constructed. Silicon substrate 102 can be a substrate made from silicon.

Silicon substrate 102 can be adjacent to dielectric diaphragm 104 and include a channel 103. For example, silicon substrate 102 can be located directly adjacent to dielectric diaphragm 104.

Channel 103 can be formed by etching silicon substrate 102. For example, channel 103 can be formed by using an anisotropic wet etching technique to create sidewalls with a slope, as shown in FIG. 1.

Although sidewalls of channel 103 are shown in FIG. 1 as having a slope, embodiments of the present disclosure are not so limited. For example, channel 103 can be formed using a deep reactive ion etching (DRIE) anisotropic etch technique resulting in sidewalls that have less of a slope (e.g., vertical) than sidewalls resulting from using an anisotropic etch. As an additional example, channel 103 can be etched to create sidewalls that are perpendicular to dielectric diaphragm 104.

Channel 103 can be configured to thermally isolate dielectric diaphragm 104. For example, dielectric diaphragm 104 can be thermally isolated by removing material (e.g., etching) in silicon substrate 102. That is, material is removed from silicon substrate 102 so that heater 110 directs heat primarily to atomic source substance 112.

Thermally isolating dielectric diaphragm 104 can increase the efficiency of the micro-structured atomic source system 100. For example, thermally isolating dielectric diaphragm 104 can ensure heat given off by heater 110 is primarily directed towards atomic source substance 112 rather than the surrounding materials of system 100 (e.g., silicon substrate 102, intermediary material 106).

The operation of micro-structured atomic source system 100 can include receiving, in chamber 105 located in intermediary material 106, atomic source substance 112, heating, via heater 110 located in dielectric diaphragm 104, atomic source substance 112 such that atomic source substance 112 sublimates to produce a flux of atoms, and directing via opening 107 in guide material 108, the flux of atoms.

In some embodiments, operation of micro-structured atomic source system 100 can take place under vacuum conditions. For example, atomic source substance 112 can be heated to sublimate to produce a flux of atoms under a vacuum. However, embodiments of the present disclosure are not so limited. For example, operation of micro-structured atomic source system 100 can take place under partial vacuum conditions or under atmospheric conditions.

The flux of atoms can be controlled by controlling a current supplied to heater 110. That is, the quantity of the stream of atoms can be controlled by current supplied to heater 110. For example, a current (e.g., 100 milliamps) can be supplied to heater 110 to produce a flux of atoms from atomic source substance 112. A larger current (e.g., 200 milliamps) can be supplied to heater 110 to produce a larger flux of atoms from atomic source substance 112.

Figure 2:
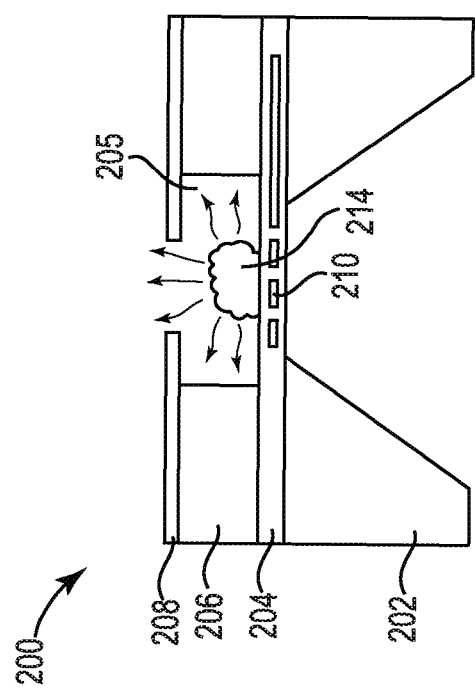
FIG. 2 illustrates a micro-structured atomic source system, in accordance with one or more embodiments of the present disclosure.

FIG. 2 illustrates a micro-structured atomic source system 200, in accordance with one or more embodiments of the present disclosure. As shown in FIG. 2, the micro-structured atomic source system 200 includes a silicon substrate 202, a dielectric diaphragm 204, an intermediary material 206 comprising a chamber 205 configured to receive an atomic source substance 214, and a guide material 208 configured to direct a flux of atoms from atomic source substance 214. The silicon substrate, dielectric diaphragm, intermediary material, chamber, and guide layer can be analogous to those described in connection with FIG. 1.

In the example shown in FIG. 2, atomic source substance 214 can be a bulk substance. For example, atomic source substance 214 can be a bulk substance when deposited in chamber 205, as will be further described herein (e.g., in connection with FIGS. 4 and 5). Atomic source substance 214 can comprise larger granules such that when atomic source substance 214 is deposited in chamber 205 it is forms a bulk mass adjacent to heater 210.

Figure 3:
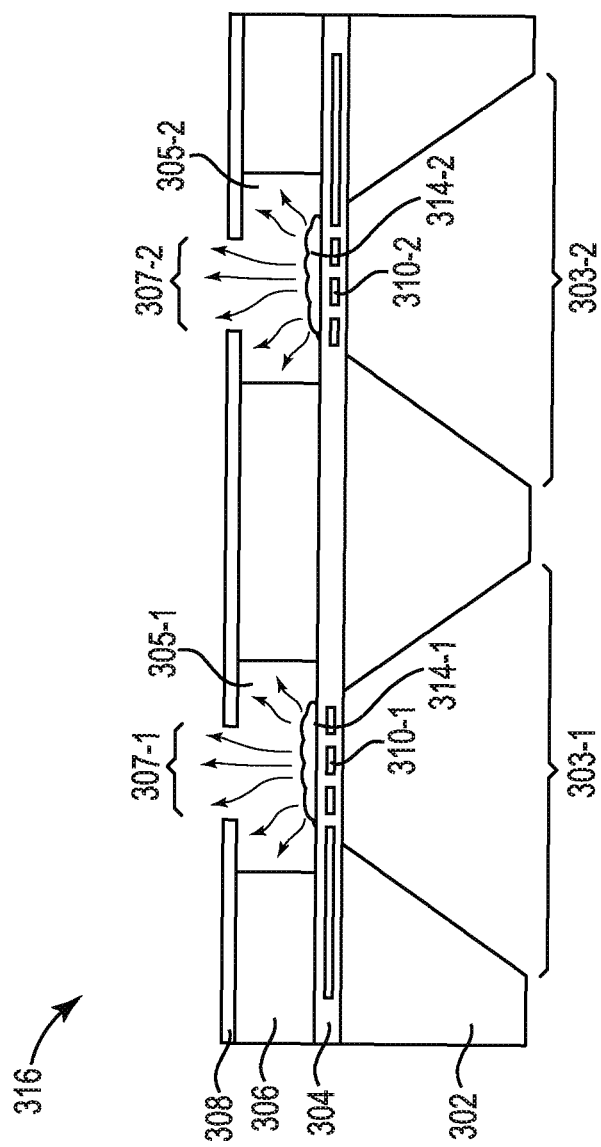
FIG. 3 illustrates a micro-structured atomic source system with multiple chambers, in accordance with one or more embodiments of the present disclosure.

FIG. 3 illustrates a micro-structured atomic source system 316 with multiple chambers, in accordance with one or more embodiments of the present disclosure. As shown in FIG. 3, the micro-structured atomic source system 316 can include a silicon substrate 302, a dielectric diaphragm 304, an intermediary material 306, and a guide material 308.

Intermediary material 306 can comprise a plurality of chambers, each configured to receive a different atomic source substance. For example, as shown in FIG. 3, intermediary material 306 can comprise a first chamber 305-1 configured to receive an atomic source substance 314-1, and a second chamber 305-2 configured to receive an atomic source substance 314-2. Intermediary material 306 can be located adjacent to silicon substrate 302 and dielectric diaphragm 304.

Although atomic source substances 314-1 and 314-2 are shown FIG. 3 as thin films, embodiments of the present disclosure are not so limited. For example, atomic source substances 314-1 and 314-2 can be bulk substances (e.g., a bulk substance as described in connection with FIG. 2).

Silicon substrate 302 can comprise one or more channels. For example, as shown in FIG. 3, silicon substrate 302 can comprise a first channel 303-1 and a second channel 303-2. Each of first channel 303-1 and second channel 303-2 can thermally isolate dielectric diaphragm 304. For example, first channel 303-1 can thermally isolate a first heater 310-1 located in dielectric diaphragm 304 adjacent first channel 303-1, and second channel 303-2 can thermally isolate a second heater 310-2 located in dielectric diaphragm 304 adjacent second channel 303-2.

Dielectric diaphragm 304 can be located adjacent to silicon substrate 302 and intermediary material 306 and can include a plurality of heaters, each configured to heat the atomic source substance located adjacent to that respective heater. As shown in FIG. 3, electric diaphragm 304 can include first heater 310-1 configured to heat atomic source substance 314-1 and second heater 310-2 configured to heat atomic source substance 314-2. Heaters 310-1 and 310-2 can be metal resistive heaters with a well-controlled temperature coefficient of resistance. For example, heaters 310-1 and 310-2 of dielectric diaphragm 304 can be platinum, a nickel/iron alloy, or any other suitable material with a well-controlled temperature coefficient of resistance.

Although not shown in FIG. 3, dielectric diaphragm 304 can include a number of temperature sensors that can determine the respective temperatures of heaters 310-1 and 310-2. Temperature sensors can include thermistors, thermocouples, resistance thermometers, or any other suitable type of temperature sensor. The respective temperatures of heaters 310-1 and 310-2 can be controlled in order to control the flux of atoms generated from respective atomic source substances 314-1 and 314-2.

Guide material 308 can comprise a plurality of openings, each configured to direct a flux of atoms from a different one of the atomic source substances. For example, as shown in FIG. 3, guide material 308 can comprise a first opening 307-1 configured to direct a flux of atoms from atomic source substance 314-1, and a second opening 307-2 configured to direct a flux of atoms from atomic source substance 314-2.

The dimensions (e.g., size) of first opening 307-1 and second opening 307-2 can be selected to direct the flux of atoms from atomic source substances 314-1 and 314-2, respectively. For example, the dimensions of first opening 307-1 and second opening 307-2 can be selected based on the target the flux of atoms from atomic source substances 314-1 and 314-2 are intended to be directed towards. That is, the dimensions of first opening 307-1 and second opening 307-2 can be selected to direct the flux of atoms from atomic source substances 314-1 and 314-2 in a specified direction. As an additional example, the dimensions of first opening 307-1 and second opening 307-2 can be selected to direct the flux of atoms from atomic source substance 314-1 in one direction, and the flux of atoms from atomic source substance 314-2 in a different direction.

Different ones of the plurality of atomic source substances can be located in different ones of the respective one or more chambers. For example, as shown in FIG. 3, atomic source substance 314-1 (e.g., iron) can be an atomic source substance that is different from atomic source substance 314-2 (e.g., silver). Atomic source substance 314-1 can be located in first chamber 305-1, and atomic source substance 314-2 can be located in second chamber 305-2.

In some embodiments, the heaters can be operated independently. For example, first heater 310-1 can be operated independently from second heater 310-2. That is, first heater 310-1 can receive a current that can be different than the current received at second heater 310-2. As a result, the magnitude of the flux of atoms from atomic source substance 314-1 can be different than the magnitude of the flux of atoms from atomic source substance 314-2.

In some embodiments, the heaters can be operated simultaneously. For example, first heater 310-1 can be operated simultaneously with second heater 310-2. That is, first heater 310-1 and second heater 310-2 can be operated to simultaneously produce a flux of atoms from atomic source substance 314-1 and a flux of atoms from atomic source substance 314-2.

Although micro-structured atomic source system 316 is shown in FIG. 3 as including two linear chambers for producing a flux of atoms from two atomic source substances, embodiments of the present disclosure are not so limited. For example, micro-structured atomic source system 316 can comprise any size of array of chambers for producing a corresponding number of fluxes of atoms. That is, system 316 can include an array (e.g., 2×2, 4×4, 5×2, 4×7, etc. . . . ) of chambers configured to receive a corresponding number of atomic source substances with a corresponding number of heaters to sublimate the number of atomic source substances to produce a corresponding number of fluxes of atoms.

Figure 4:
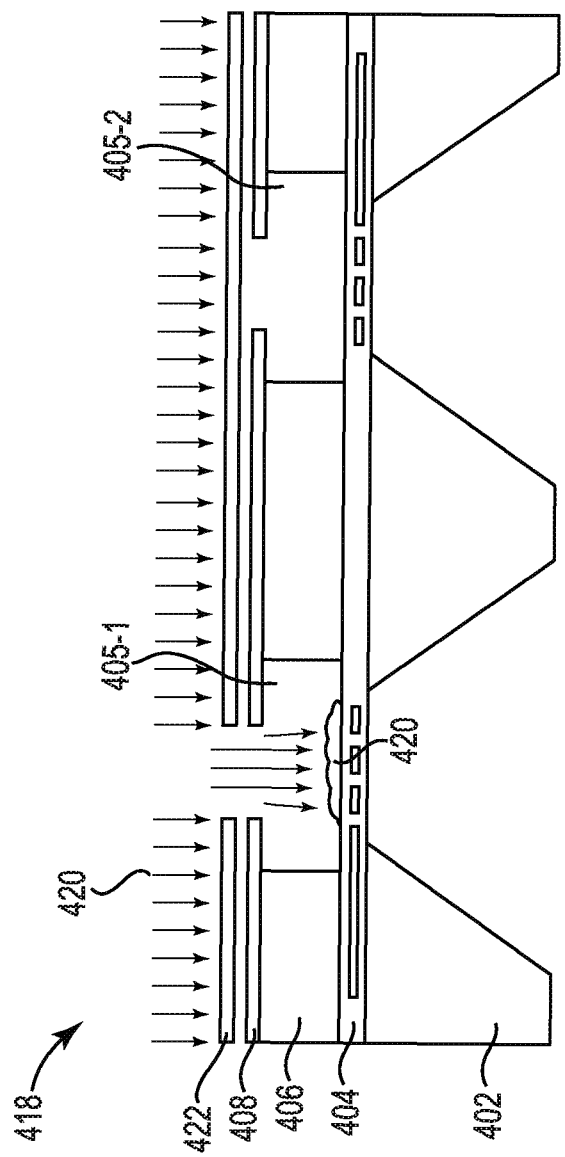
FIG. 4 illustrates a micro-structured atomic source system receiving an atomic source substance by a shadow mask, in accordance with one or more embodiments of the present disclosure.

FIG. 4 illustrates a micro-structured atomic source system 418 receiving an atomic source substance 420 by a shadow mask 422, in accordance with one or more embodiments of the present disclosure. As shown in FIG. 4, the micro-structured atomic source system 418 can include a silicon substrate 402, a dielectric diaphragm 404, an intermediary material 406, and a guide material 408.

Shadow mask 422 can be a planar material that includes a number of openings to allow atomic source substances (e.g., atomic source substance 420) to pass through shadow mask 422. The number of openings in shadow mask 422 can be etched (e.g., DRIE etch techniques or anisotropic wet etch techniques).

Shadow mask 422 can be positioned over micro-structured atomic source system 418 such that the number of openings of shadow mask 422 are aligned with the number of openings of guide material 408 corresponding to the number of chambers that are to receive atomic source substance 420.

Atomic source substance 420 can be received by a first chamber 405-1 via an opening in shadow mask 422. For example, after an opening of shadow mask 422 is aligned with an opening (e.g., first opening 307-1 as described in connection with FIG. 3) of guide material 408, atomic source substance 420 can be deposited on shadow mask 422, resulting in atomic source substance 420 being deposited in first chamber 405-1 by passing through shadow mask 422 and falling into first chamber 405-1. The remaining amount of atomic source substance 420 is deposited on a surface of shadow mask 422. No amount of atomic source substance 420 is deposited in a chamber (e.g., chamber 405-2) not intended to receive atomic source substance 420.

Although described as one atomic source substance 420 being deposited in one chamber through one opening of shadow mask 422, embodiments of the present disclosure are not so limited. For example, atomic source substance 420 can be deposited in more than one chamber through more than one opening of shadow mask 422 where the openings of the guide material corresponding to the respective chamber and the respective openings of the shadow mask are in alignment.

Figure 5:
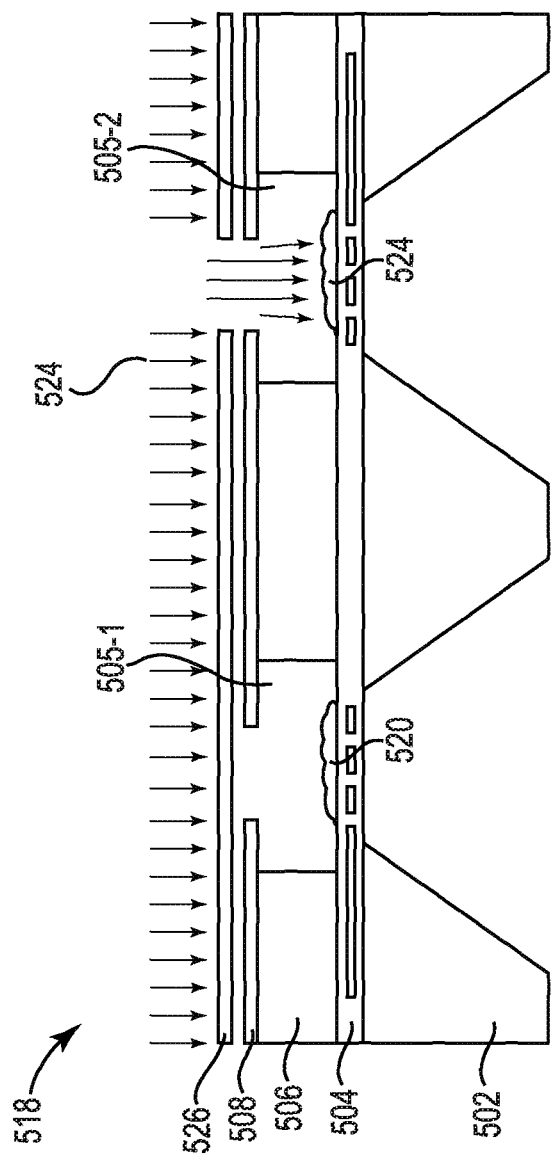
FIG. 5 illustrates a micro-structured atomic source system receiving an atomic source substance by a shadow mask, in accordance with one or more embodiments of the present disclosure.

FIG. 5 illustrates a micro-structured atomic source system 518 receiving an atomic source substance 524 by a shadow mask 526, in accordance with one or more embodiments of the present disclosure. As shown in FIG. 5, the micro-structured atomic source system 518 can include a silicon substrate 502, a dielectric diaphragm 504, an intermediary material 506, and a guide material 508.

Shadow mask 526 can be a planar material that includes a number of openings to allow material (e.g., atomic source substance 524) to pass through shadow mask 526. Similar to the shadow mask described in connection with FIG. 4 (e.g., shadow mask 422), the number of openings in shadow mask 526 can be etched.

Shadow mask 526 can be positioned over micro-structured atomic source system 518 such that the number of openings of shadow mask 526 are aligned with the number of openings of guide material 508 corresponding to the number of chambers that are to receive atomic source substance 524.

Atomic source substance 524 can be received by a second chamber 505-2 via shadow mask 526. For example, after an opening of shadow mask 526 is aligned with an opening (e.g., second opening 307-2 as described in connection with FIG. 3) of guide material 508, atomic source substance 524 can be deposited on shadow mask 526, resulting in atomic source substance 524 being deposited in second chamber 505-2 by passing through shadow mask 526 and falling into second chamber 505-2. The remaining amount of atomic source substance 524 is deposited on a surface of shadow mask 526. No amount of atomic source substance 524 is deposited in a chamber (e.g., chamber 505-1) not intended to receive atomic source substance 524.

First chamber 505-1 can include an atomic source substance 520 (e.g., atomic source substance 420 as described in connection with FIG. 4) that has been previously received in first chamber 505-1. No amount of atomic source substance 524 is received in first chamber 505-1.

Although described as one atomic source substance 524 being deposited in one chamber through one opening of shadow mask 526, embodiments of the present disclosure are not so limited. For example, atomic source substance 524 can be deposited in more than one chamber through more than one opening of shadow mask 526 where the openings of the guide material corresponding to the respective chamber and the respective openings of the shadow mask are in alignment.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A micro-structured atomic source system, comprising:
   a diaphragm located adjacent to a substrate wherein the substrate includes a channel, the diaphragm including a heater configured to heat an atomic source substance;
   an intermediary material adjacent to the diaphragm, the intermediary material comprising a chamber with an opening configured to receive the atomic source substance; and
   a guide material adjacent to the intermediary material, the guide material partially covering the opening of the chamber, wherein the guide material is configured to direct a flux of atoms from the atomic source substance.

2. The micro-structured atomic source system of claim 1, wherein the chamber is etched by an isotropic wet etch.

3. The micro-structured atomic source system of claim 1, wherein the chamber is etched by a dry etch and an isotropic wet etch.

4. The micro-structured atomic source system of claim 3, wherein the chamber is etched vertically by the dry etch and etched horizontally by the isotropic wet etch.

5. The micro-structured atomic source system of claim 1, wherein the channel is etched by an anisotropic wet etch.

6. The micro-structured atomic source system of claim 5, wherein walls of the channel are etched at a slope by the anisotropic wet etch.

7. The micro-structured atomic source system of claim 1, wherein the channel is etched by a deep reactive ion etch (DRIE) anisotropic etch.

8. The micro-structured atomic source system of claim 7, wherein walls of the channel are etched vertically by the DRIE anisotropic etch.

9. The micro-structured atomic source system of claim 1, wherein the opening of the chamber is formed by a wet etch.

10. The micro-structured atomic source system of claim 1, wherein the opening of the chamber is formed by ion milling.

11. A method for operating a micro-structured atomic source system, comprising:
    receiving an atomic source substance through etched openings of one or more chambers located in an intermediary material located adjacent to a diaphragm;
    heating, via heaters located in the diaphragm, the atomic source substance such that the atomic source substance sublimates to produce a flux of atoms; and
    directing, via openings located in a guide material located adjacent to the intermediary material and partially covering each of the openings of each respective chamber, the flux of atoms.

12. The method of claim 11, wherein the method includes directing the flux of atoms from a first opening of the openings in a first direction and directing the flux of atoms from a second opening of the openings in a second direction.

13. The method of claim 12, wherein the first direction is the same as the second direction.

14. The method of claim 12, wherein the first direction is different from the second direction.

15. The method of claim 11, wherein the method includes aligning a shadow mask with the openings in the chambers to receive the atomic source substance.

16. A micro-structured atomic source system, comprising:
    a diaphragm located adjacent to a substrate that includes etched channels, wherein the diaphragm includes heaters, where each heater is configured to heat a different one of atomic source substances, wherein each different atomic source substance is located adjacent to its respective heater;
    an intermediary material located adjacent to the substrate and the diaphragm comprising one or more chambers, where each chamber includes an etched opening, wherein each of the chambers are configured to receive a different one of the atomic source substances; and
    a guide material located adjacent to the intermediary material and including the etched openings, each of the etched openings configured to direct a flux of atoms from a different one of the atomic source substances, wherein the guide material partially covers each of the etched openings of each of the chambers.

17. The micro-structured atomic source system of claim 16, wherein different ones of the atomic source substances are located in different chambers.

18. The micro-structured atomic source system of claim 17, wherein a flux of atoms of the different ones of the atomic source substances are directed in different directions.

19. The micro-structured atomic source system of claim 16, wherein a magnitude of a flux of atoms of a first one of the atomic source substances is different than a magnitude of a flux of atoms of a second one of the atomic source substances.

20. The micro-structured atomic source system of claim 16, wherein a magnitude of a flux of atoms of a first one of the atomic source substances is the same as a magnitude of a flux of atoms of a second one of the atomic source substances.

\* \* \* \* \*